(12) United States Patent
Miyo et al.

(10) Patent No.: US 8,264,869 B2
(45) Date of Patent: Sep. 11, 2012

(54) SEMICONDUCTOR STORAGE DEVICE (75) Inventors: Toshiya Miyo, Yokohama (JP);
Atsumasa Sako, Yokohama (JP)

(73) Assignee: Fujitsu Semiconductor Limited, Yokohama-shi (JP)

( * ) Notice: Subject to any disclaimer, the term of this patent is extended or adjusted under 35 U.S.C. 154(b) by 205 days.

(21) Appl. No.: 12/779,707

(22) Filed: May 13, 2010

(65) Prior Publication Data
US 2010/0290267 A1   Nov. 18, 2010

(30) Foreign Application Priority Data
May 14, 2009 (JP) ................... 2009-117202

(51) Int. Cl.
*G11C 11/24* (2006.01)
(52) U.S. Cl. ......... 365/149; 365/150; 365/190; 365/226
(58) Field of Classification Search .................. 365/149, 365/226, 150, 190
See application file for complete search history.

(56) References Cited

U.S. PATENT DOCUMENTS

| | | | | |
|---|---|---|---|---|
| 5,317,532 A | * | 5/1994 | Ochii | 365/149 |
| 6,147,917 A | * | 11/2000 | Brady | 365/206 |
| 6,741,118 B2 | | 5/2004 | Uchikoba et al. | |
| 6,990,031 B2 | * | 1/2006 | Hashimoto et al. | 365/222 |
| 7,426,147 B2 | * | 9/2008 | Ogiwara et al. | 365/189.09 |
| 7,675,773 B2 | * | 3/2010 | Mori et al. | 365/185.03 |

FOREIGN PATENT DOCUMENTS

JP   2003-168293 A   6/2003

* cited by examiner

*Primary Examiner* — Pho M Luu
(74) *Attorney, Agent, or Firm* — Arent Fox LLP (57) ABSTRACT

A semiconductor storage device includes a memory cell array in which a memory cell including an MOS capacitor is arranged; a power supply unit that supplies a plate voltage to a plate line that is coupled to a gate electrode of the MOS capacitor; and a switch that couples the plate line to a first power supply line when an access to the memory cell array is caused.

8 Claims, 7 Drawing Sheets

SEMICONDUCTOR STORAGE DEVICE

CROSS-REFERENCE TO RELATED APPLICATIONS

This application is based upon and claims the benefit of priority of the prior Japanese Patent Application No. 2009-117202, filed on May 14, 2009, the entire contents of which are incorporated herein by reference.

FIELD

The present disclosure relates to a semiconductor storage device that includes a memory cell array having an arrangement of memory cells that include Metal-Oxide-Semiconductor (MOS) capacitors.

BACKGROUND

A known semiconductor storage device is called an embedded Dynamic Random Access Memory (eDRAM) integrated over a Large Scale Integration (LSI) made up of a logical circuit that includes a microprocessor, etc. The eDRAM is a DRAM that uses an MOS capacitor for retaining cell data and is configured to achieve high speed operation. The data storage mechanism in the DRAM involves accumulating cell data in an MOS capacitor that makes up a memory cell and controlling input and output of cell data to and from the MOS capacitor by an MOS transistor for switching.

In the DRAM, data is retained by setting a voltage of a plate line coupled to the MOS capacitor to a certain negative voltage.

Conventionally, in order to stabilize this negative voltage, a semiconductor storage device has two detectors, one for detecting when the plate voltage becomes smaller than a certain level and the other for detecting when the plate voltage becomes larger than a certain level (for example, Japanese Laid-open Patent Publication No. 2003-168293). In the semiconductor storage device, two detectors are almost always activated to maintain the level of the plate voltage at a certain negative voltage by increasing or decreasing the plate voltage when the plate voltage moves out of the desired range.

In the semiconductor device, disturbances caused at writing may cause a large shift in the plate voltage in the direction of a negative potential, thereby causing a data on the memory cell to be lost.

When the negative voltage is stabilized by using two detectors to prevent data loss due to disturbance at writing, the two detectors are substantially always in an activated state. Thus, in the conventional semiconductor device, increased power consumption is a drawback.

SUMMARY

Aspects in accordance with the invention include a semiconductor storage device having a memory cell array in which a memory cell that includes an MOS capacitor is arranged; a power supply unit that supplies a plate voltage to a plate line that is coupled to a gate electrode of the MOS capacitor; and a switch that couples the plate line to a first power supply line when an access to the memory cell array is caused.

DESCRIPTION OF EMBODIMENTS

Figure 1:
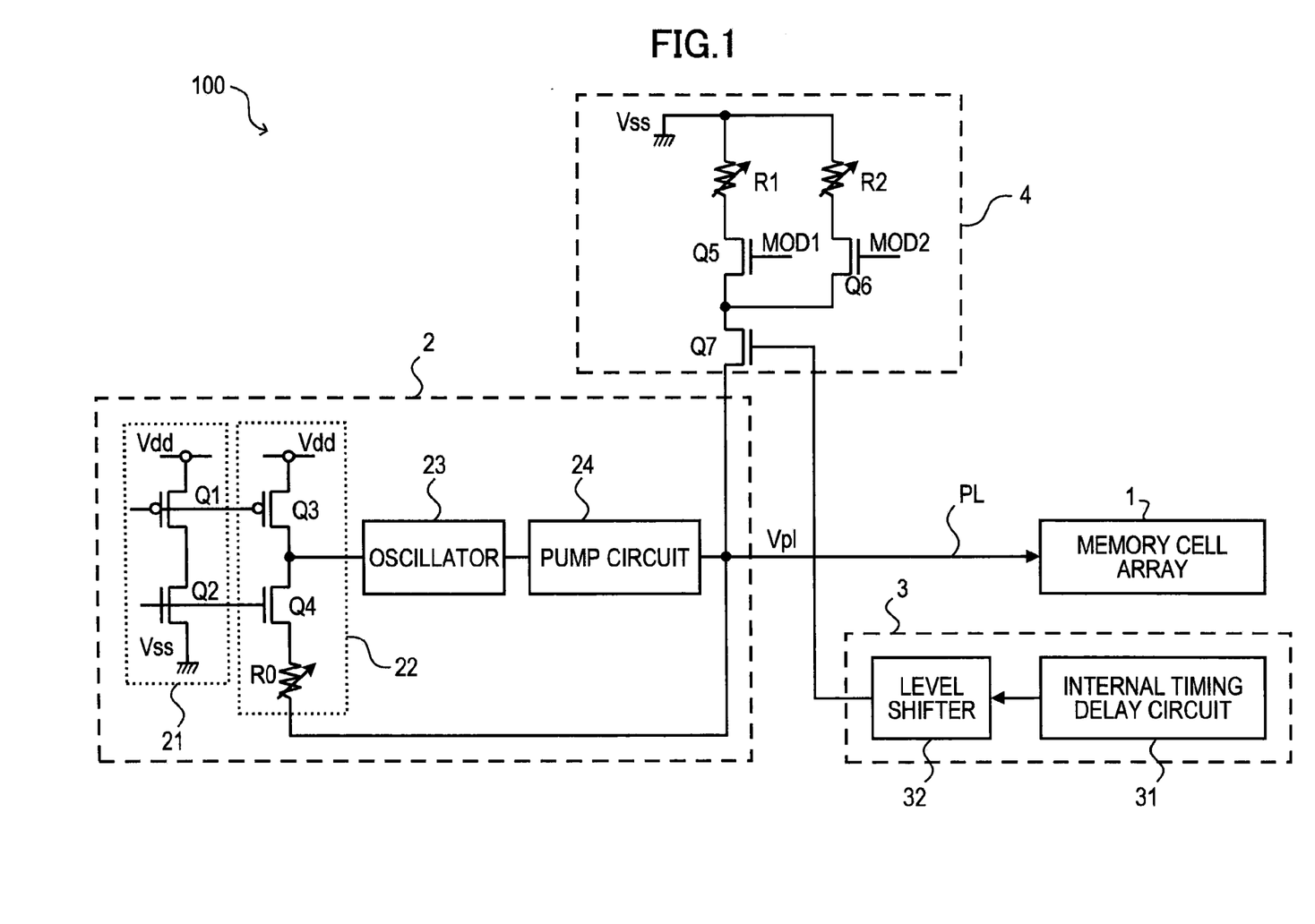
FIG. 1 is a circuit diagram illustrating a main configuration of a semiconductor storage device in accordance with aspects of the present invention.

FIG. 1 is a circuit diagram illustrating the main configuration of a semiconductor storage device in accordance with aspects of the present invention.

A semiconductor storage device 100 includes a memory cell array 1, a power supply unit 2, a switching timing control unit 3, and a switching unit 4.

The memory cell array 1 includes a plurality of memory cells (DRAM cell) arranged in a matrix. Each memory cell includes an MOS capacitor. A plate line PL is coupled to each of the MOS capacitors. The memory cell array 1 will be described with reference to FIG. 5.

A power supply unit 2 includes a current source 21, a current detection circuit 22, an oscillator 23, and a pump circuit 24. The power supply unit 2 supplies a plate voltage Vpl having a certain voltage to the plate line PL. The plate voltage Vpl is a negative voltage that is desired for retaining cell data in the MOS capacitor of the memory cell array 1.

The current source 21 includes a p-channel MOS transistor (hereinafter referred to as pMOS) Q1 and an n-channel MOS transistor (hereinafter referred to as nMOS) Q2. A power supply voltage Vdd is applied to a source electrode of the pMOS Q1, and a drain electrode of the pMOS Q1 is coupled to a drain electrode of the nMOS Q2. A source electrode of the nMOS Q2 is grounded and becomes the ground potential Vss. A voltage source such as a band gap reference (BGR) circuit may be used instead of a current source 21.

A voltage detection circuit 22 includes a pMOS Q3, an nMOS Q4, and a variable resistor R0. A power supply voltage Vdd is applied to a source electrode of the pMOS Q3, and a drain electrode of the pMOS Q3 is coupled to a drain electrode of the nMOS Q4. A source electrode of the nMOS Q4 is coupled to the plate line PL through the variable resistor R0. The above described voltage detection circuit 22 detects a plate voltage Vpl of the plate line PL that is feedback from the pump circuit 24 through the variable resistor R0.

The oscillator 23 is, for example, a ring oscillator that turns on and off the oscillation operation based on the result of the detection of the plate voltage Vpl in the voltage detection circuit 22.

The pump circuit 24 is activated by the oscillation output of the oscillator 23 and pumps the plate voltage Vpl for the plate line PL to a negative voltage direction.

The switching timing control unit 3 includes an internal timing delay circuit 31 and a level shifter 32.

The internal timing delay circuit 31 generates, for example, a row address strobe signal RAS as a memory activation signal for activating the memory cell array 1 and inputs the signal to the switching unit 4 through the level shifter 32.

The level shifter 32 adjusts a voltage level of the memory activation signal in order to input the memory activation signal to a gate electrode of an nMOS Q7, which will be described later, of the switching unit 4.

The switching unit 4 includes a switch (for example, the nMOS Q7 in the example illustrated in FIG. 1) that couples the plate line PL to a power line (ground line with a ground potential Vss) when the memory cell array is accessed. The switch may detect an access to the memory cell array 1 by inputting a memory activation signal.

The switching unit 4 includes a resistor R1 and a resistor R2 with different resistance values from each other and three nMOSs Q5, Q6, and Q7. The nMOSs Q5 and Q6 function as a mode selection switch. A drain electrode of the nMOS Q5 is grounded through the resistor R1 and a source electrode of the nMOS Q5 is coupled to a drain electrode of the nMOS Q7. A drain electrode of the nMOS Q6 is grounded through the resistor R2, and a source electrode of the nMOS Q6 is coupled to a drain electrode of the nMOS Q7. Mode switching signals MOD1 and MOD2 are supplied to gate electrodes of the nMOS Q5 and nMOS Q6, respectively, so that the nMOS Q5 and nMOS Q6 are selectively turned on. A source electrode of the nMOS Q7 is coupled to the plate line PL of the memory cell array 1 and a memory activation signal is supplied to a gate electrode of the nMOS Q7 from the internal timing delay circuit 31 through the level shifter 32.

The mode switching signals, MOD1 or MOD2 may be input from a logic circuit side, which is not illustrated. The details will be described later.

In the switching unit 4, the nMOS Q7 is on-off controlled by a memory activation signal that is output from the level shifter 32. The mode switching signals, MOD1 or MOD2 are selected according to an operation frequency set by the memory cell array 1. By turning on the nMOS Q5 or Q6 with the mode switching signal MOD1 or MOD2, a drain electrode of the nMOS Q7 operates with a ground potential Vss through one of the resistors R1 and R2. If one of the resistors R1 and R2 with a larger resistance value is selected, the current flowing therethrough will become small. If one of the resistors R1 and R2 with a smaller resistance value is selected, the current flowing therethrough will become large. Thus, a current that corresponds to a size of an operation frequency of the memory cell array 1 may flow from a ground potential Vss to the plate line PL in synchronization with an access to the memory cell array 1.

In FIG. 1, one of the resistors R1 and R2 is selected depending on the two mode switching signals MOD1 and MOD2. Three or more switches for mode selection and selection of resistors may be provided. A resistance value may be changed according to a mode switching signal by using one variable resistor.

Figure 2:
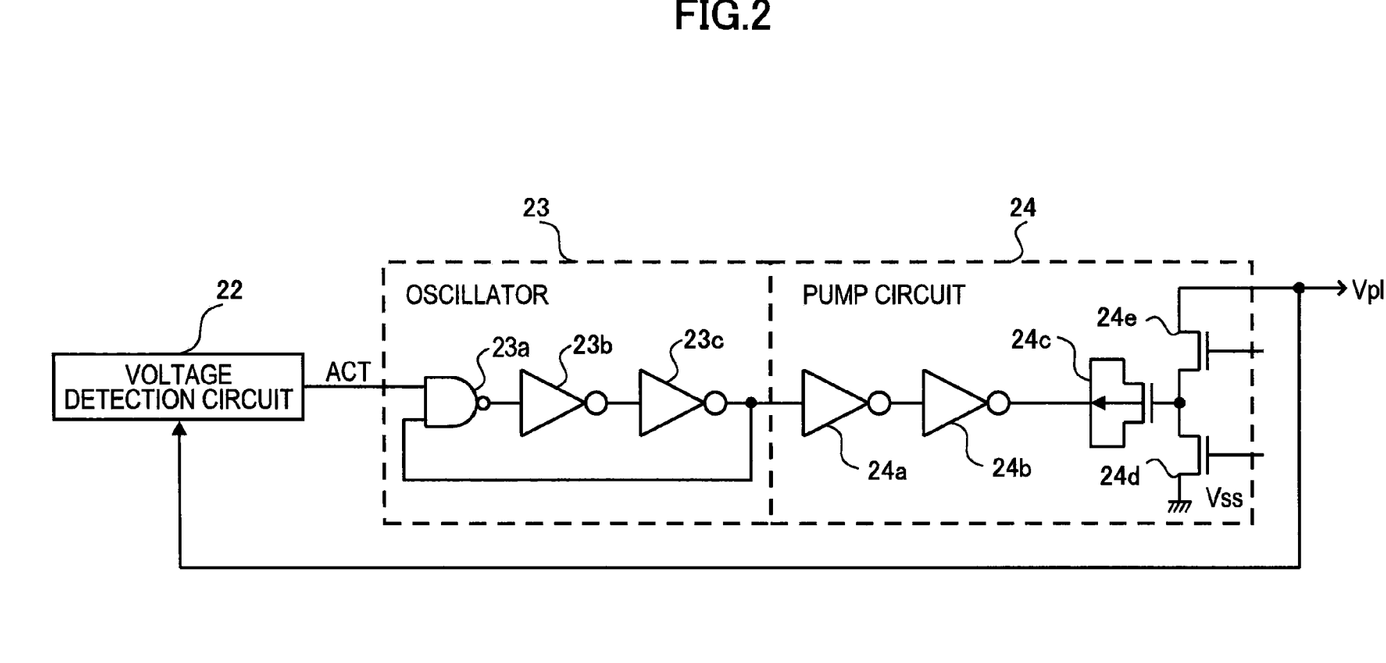
FIG. 2 illustrates an example of an oscillator and a pump circuit in a power supply unit illustrated in FIG. 1 in accordance with aspects of the present invention.

FIG. 2 illustrates an example of an oscillator 23 and a pump circuit 24 in the power supply unit 2 illustrated in FIG. 1 in accordance with aspects of the present invention.

The oscillator 23 includes a NAND circuit 23a and two inverters 23b and 23c. When the oscillator 23 receives an act signal ACT notifying it that a plate voltage Vpl exceeds a certain reference voltage, the oscillator 23 outputs a square waveform of a certain frequency to the pump circuit 24.

The pump circuit 24 includes two inverters 24a and 24b, an MOS capacitor 24c, and serially coupled nMOS 24d and nMOS 24e. For example, the nMOS 24d and the nMOS 24e are turned on according to a control signal from a logic circuit, which is not illustrated. When a plate voltage Vpl is reduced, the nMOS 24d is turned off, and the nMOS 24e is turned on, and the plate voltage Vpl is reduced according to a signal from the oscillator 23.

Hereinafter, operation of the semiconductor storage device 100 illustrated in FIG. 1 will be described.

Figure 3:
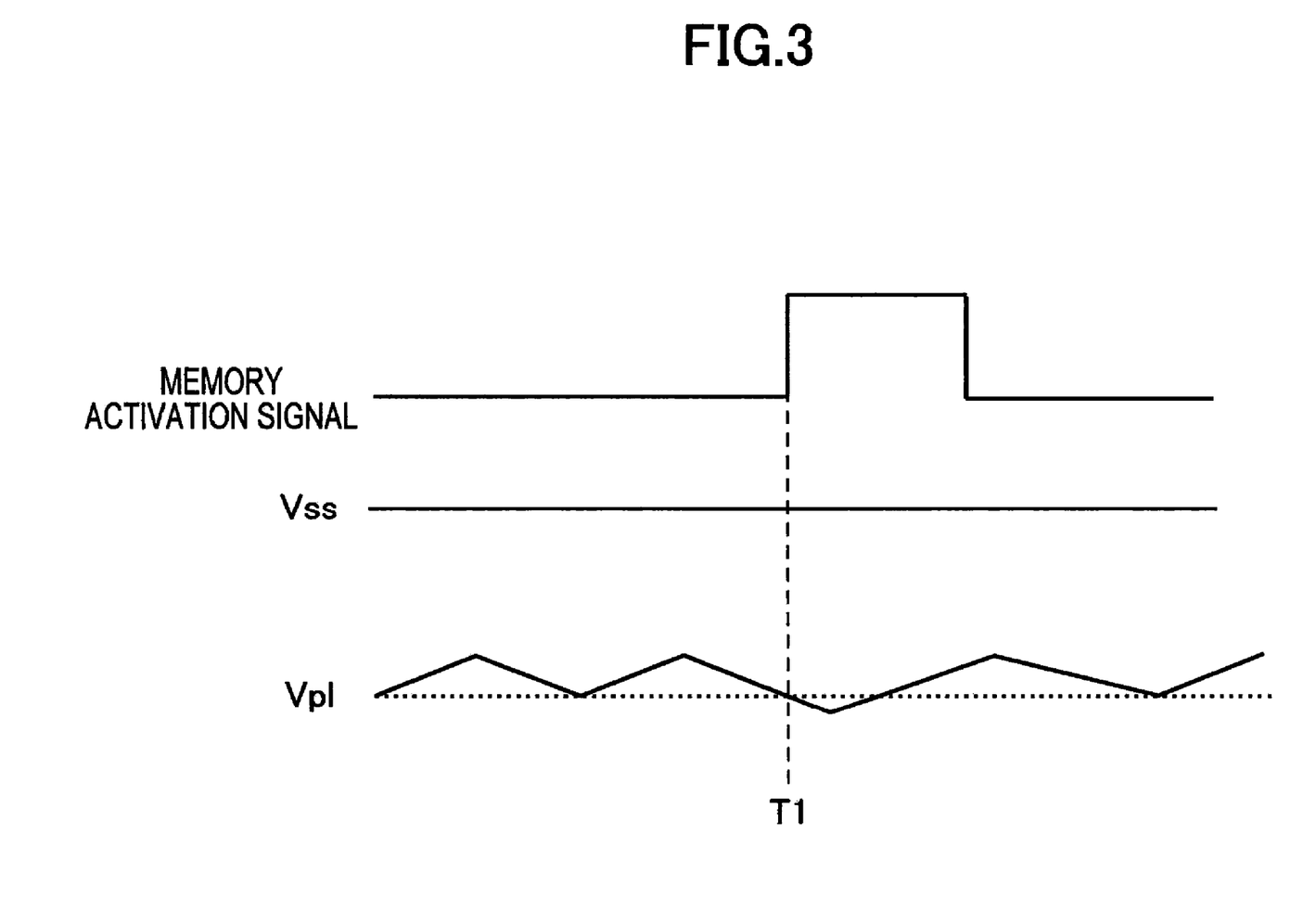
FIG. 3 is a timing chart illustrating relationship between a memory activation signal from an internal timing delay circuit illustrated in FIG. 1 and a plate voltage in accordance with aspects of the present invention.

FIG. 3 is a timing chart illustrating relationship between a memory activation signal from an internal timing delay circuit 31 illustrated in FIG. 1 and a plate voltage Vpl in accordance with aspects of the present invention.

The plate voltage Vpl is increased toward a ground voltage Vss side as time passes due to a leak current, etc. The voltage detection circuit 22 detects a plate voltage Vpl and drives the oscillator 23 when the plate voltage Vpl becomes higher than a certain voltage. The pump circuit 24 reduces the plate voltage Vpl. The voltage detection circuit 22 stops the oscillator 23 when the plate voltage Vpl is reduced to a certain voltage.

The nMOS Q7 in a switching unit 4 is turned on when the memory cell array 1 is accessed and a memory activation signal becomes a high level (timing T1). Accordingly, the plate line PL is grounded through one of the resistors R1 and R2 selected by the mode switching signals MOD1 or MOD2.

The semiconductor storage device 100 according to the embodiment achieves the following effects.

There is a phenomenon in which a negative plate voltage Vpl becomes large and exceeds a desired amount when a write access for replacing data 1 accumulated in each memory cell with data 0 is caused. This occurs because the plate voltage is excessively pumped due to substantially simultaneous multi-bit writings.

For example, when a eDRAM performs high-speed access with 100 MHz or more and operates with multiple busses, large parasitic capacitance may be caused between neighboring word lines, etc. Hence, when data 1 accumulated in respective memory cells are replaced with data 0 substantially simultaneously, the plate voltage Vpl is pumped, causing large amounts of disturbance, and the plate voltage Vpl experiences a large shift in the negative potential direction. As a result, the wrong data may be read from the memory cell under a low read voltage.

However, according to the semiconductor storage device 100, as described above, the plate line PL is grounded through the resistor R1 or R2 when an access to the memory cell array 1 is detected. Accordingly, as illustrated in FIG. 2, the plate voltage Vpl is increased to the ground potential Vss. Hence, influence of disturbance to the plate voltage Vpl during a data writing operation to the memory cell may be reduced.

Moreover, for example, charges due to disturbance caused in the plate voltage Vpl may be discharged even for an eDRAM that operates with multiple busses and high speed access with 100 MHz or more. Moreover, current consumption during a standby mode may be reduced because current is not continuously consumed, but rather a current route in the switching unit 4 is formed only when an access to the memory cell array is caused.

A selectable plurality of resistors R1 and R2 are coupled in parallel between the ground potential Vss and the plate line PL, therefore, selecting one of resistance values of the resistors R1 or R2 depending on an operation speed of the semiconductor storage device 100 may reduce current consumption. Particularly, during data retention periods in which a refresh operation continues without read and write operations (standby state), power consumption may be effectively reduced.

The above described semiconductor storage device 100 is applied to the following eDRAM.

Figure 4:
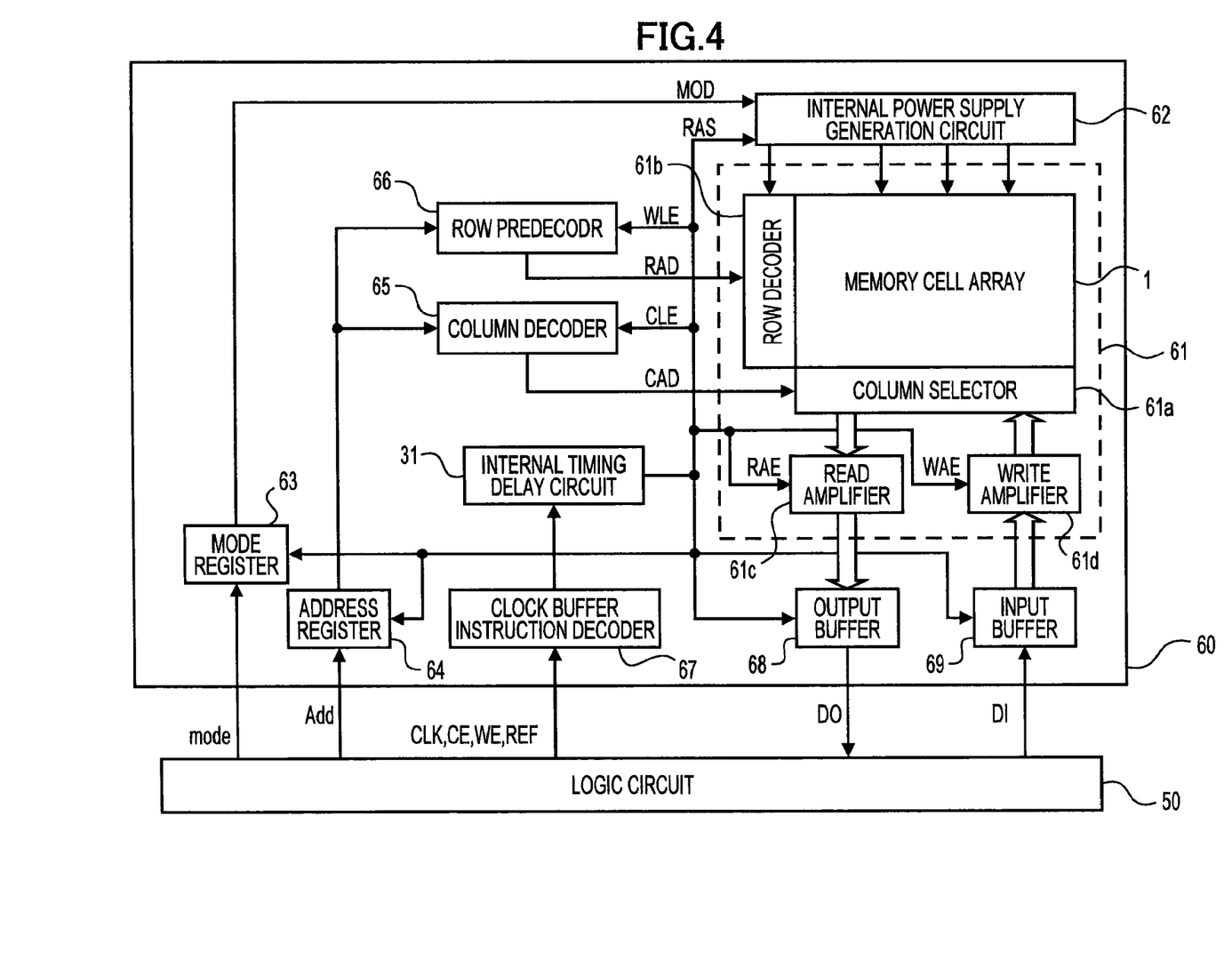
FIG. 4 is a block diagram illustrating a configuration of an eDRAM in accordance with aspects of the present invention.

FIG. 4 is a block diagram illustrating a configuration of an eDRAM in accordance with aspects of the present invention.

The same reference numerals are applied to components that are substantially the same as those components illustrated in FIG. 1.

For example, an eDRAM 60 that is integrally configured with a system on chip (SoC) logic circuit 50 in which a plurality of functional blocks are mounted on one chip will be described.

The logic circuit 50 supplies a mode signal mode, an address signal Add, a clock signal CLK, a chip enable signal CE, a write enable signal WE, and a refresh timing signal REF etc. to the eDRAM 60. Read data DO and write data DI are sent and received between the logic circuit 50 and the eDRAM 60.

The eDRAM 60 includes a memory core 61, an internal power supply generation circuit 62, a mode register 63, an address register 64, a column decoder 65, a row pre-decoder 66, a clock buffer and instruction decoder 67, an output buffer 68, and an input buffer 69. The eDRAM 60 includes the internal timing delay circuit 31 illustrated in FIG. 1. The remaining components illustrated in FIG. 1 are included, for example, in the internal power supply generation circuit 62 except for the memory cell array 1 and the internal timing delay circuit 31.

The logic circuit 50 supplies a clock signal CLK, a chip enable signal CE, a write enable signal WE, and a refresh timing signal REF to the internal timing delay circuit 31 through the clock buffer and instruction decoder 67. The internal timing delay circuit 31 is coupled to the mode register 63 and the address register 64 and supplies clock signals CLK to the circuits of the mode register 63 and the address register 64.

The internal timing delay circuit 31 is coupled to the output buffer 68 and the input buffer 69 and instructs the output buffer 68 and the input buffer 69 to accumulate read data DO from the memory core 61 and write data DI to a memory core 61.

The internal timing delay circuit 31 generates and supplies a row address strobe signal RAS to the internal power supply generation circuit 62 as the above described memory activation signal. The internal timing delay circuit 31 supplies a word line control signal WLE to a column decoder 65 and supplies a column control signal CLE to a row pre-decoder 66.

The memory core 61 includes a memory cell array 1, a column selector 61a, a row decoder 61b, a read amplifier 61c, and a write amplifier 61d.

The column selector 61a receives a column address signal CAD from the column decoder 65 and selects a column of the memory cell array 1 according to the column address signal CAD.

The row decoder 61b inputs a row address signal RAD from the row pre-decoder 66 and selects a row of the memory cell array 1 according to the row address signal RAD.

The read amplifier 61c reads data in the memory cell array 1 according to a read and amplifier control signal RAE generated by the internal timing delay circuit 31.

The write amplifier 61d writes data to the memory cell array 1 according to a write amplifier control signal WAE generated by the internal timing delay circuit 31.

The internal power supply generation circuit 62 receives a mode switching signal MOD (MOD1 and MOD2 illustrated in FIG. 1), and a row address strobe signal RAS etc., and generates a plurality of internal power supply voltages such as a plate voltage Vpl and supplies the voltages to the memory core 61.

The mode register 63 receives a mode signal mode from the logic circuit 50 and outputs a mode switching signal MOD to the internal power supply generation circuit 62.

The address register 64 receives an address signal Add from the logic circuit 50 and supplies the address signal Add to the column decoder 65 and the row pre-decoder 66.

The column decoder 65 generates a column address signal CAD by decoding the column control signal CLE received from the internal timing delay circuit 31 and supplies the column address signal CAD to the column selector 61a.

The row pre-decoder 66 generates a row address signal RAD by decoding the word line control signal WLE received from the internal timing delay circuit 31 and supplies the row address signal RAD to the row decoder 61b.

The clock buffer and instruction decoder 67 receives a clock signal CLK, a chip enable signal CE, a write enable signal WE, and a refresh timing signal REF from the logic circuit 50 and supplies the signals to the input timing delay circuit 31.

The output buffer 68 accumulates read data DO from the memory core 61 and outputs the read data DO to the logic circuit 50 under control of the internal timing delay circuit 31.

The input buffer 69 accumulates the write data DI received from the logic circuit 50 and supplies the write data DI to the memory core 61 under control of the internal timing delay circuit 31.

Figure 5:
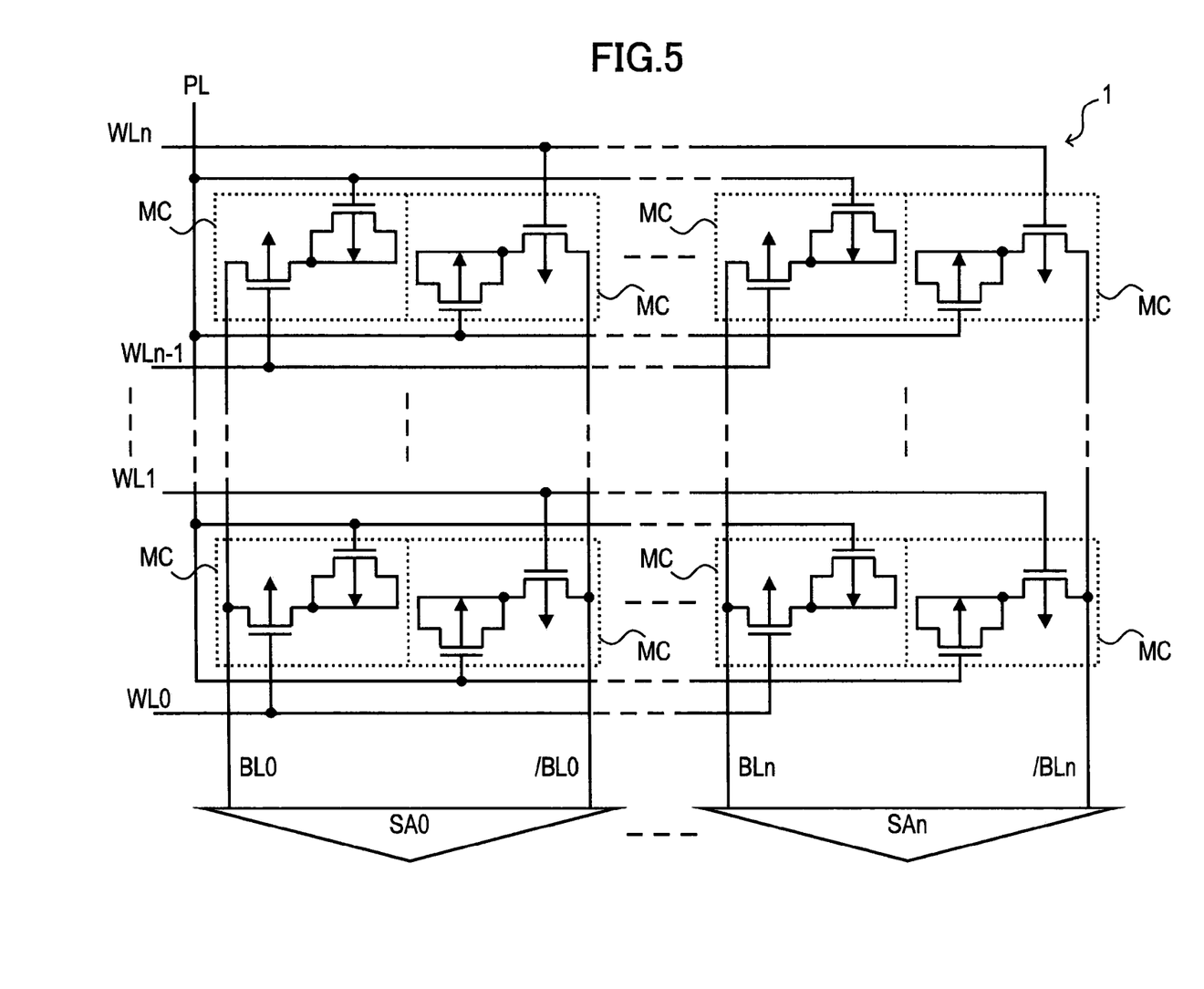
FIG. 5 illustrates an example of a memory cell array in accordance with aspects of the present invention.

FIG. 5 illustrates an example of the memory cell array 1 in accordance with aspects of the present invention. The memory cell array 1 includes a plurality of memory cells MC that are arranged in a matrix at intersections of a plurality of word lines WL0 to WLn and a plurality of bit-lines BL0, /BL0 to BLn, /BLn. Each memory cell MC is a DRAM cell and configured with a transfer transistor and an MOS capacitor that are serially coupled between a corresponding bit-line BL (or a bit-line /BL) and a plate line PL. A gate electrode of a transfer transistor of each memory cell MC is coupled to corresponding word lines WL0 to WLn.

A plurality of sense amplifiers SA0 to SAn are provided corresponding to a plurality of bit-line pairs, BL0 and /BL0 to BLn and /BLn respectively. Each of the sense amplifier SA0 to SAn amplifies a potential difference between a corresponding bit-line pair, BL and /BL according to an activation timing of a sense amplifier control signal, which is not illustrated. In the memory cell array 1, a plurality of equalization circuits and a plurality of pre-charge circuits etc. are provided for respective bit-line pairs BL and /BL.

The row decoder 61b illustrated in FIG. 4 activates one of a plurality of word lines WL0 to WLn according to a row address signal RAD. The column selector 61a selects a certain number of bit-line pairs, BL0 and /BL0 to BLn and /BLn according to a column address signal CAD, and couples the selected bit-line pair BL and /BL to a multi-bit internal data bus, which is not illustrated. The read amplifier 61c amplifies a data signal over the internal data bus and outputs the signal to the output buffer 68 during an activation period (read operation period) of a read amplifier control signal RAE. The write amplifier 61d amplifies data signal of the input buffer 69 and outputs the data signal to the internal data bus during an activation period (write operation period) of a write amplifier control signal WAE.

Figure 6:
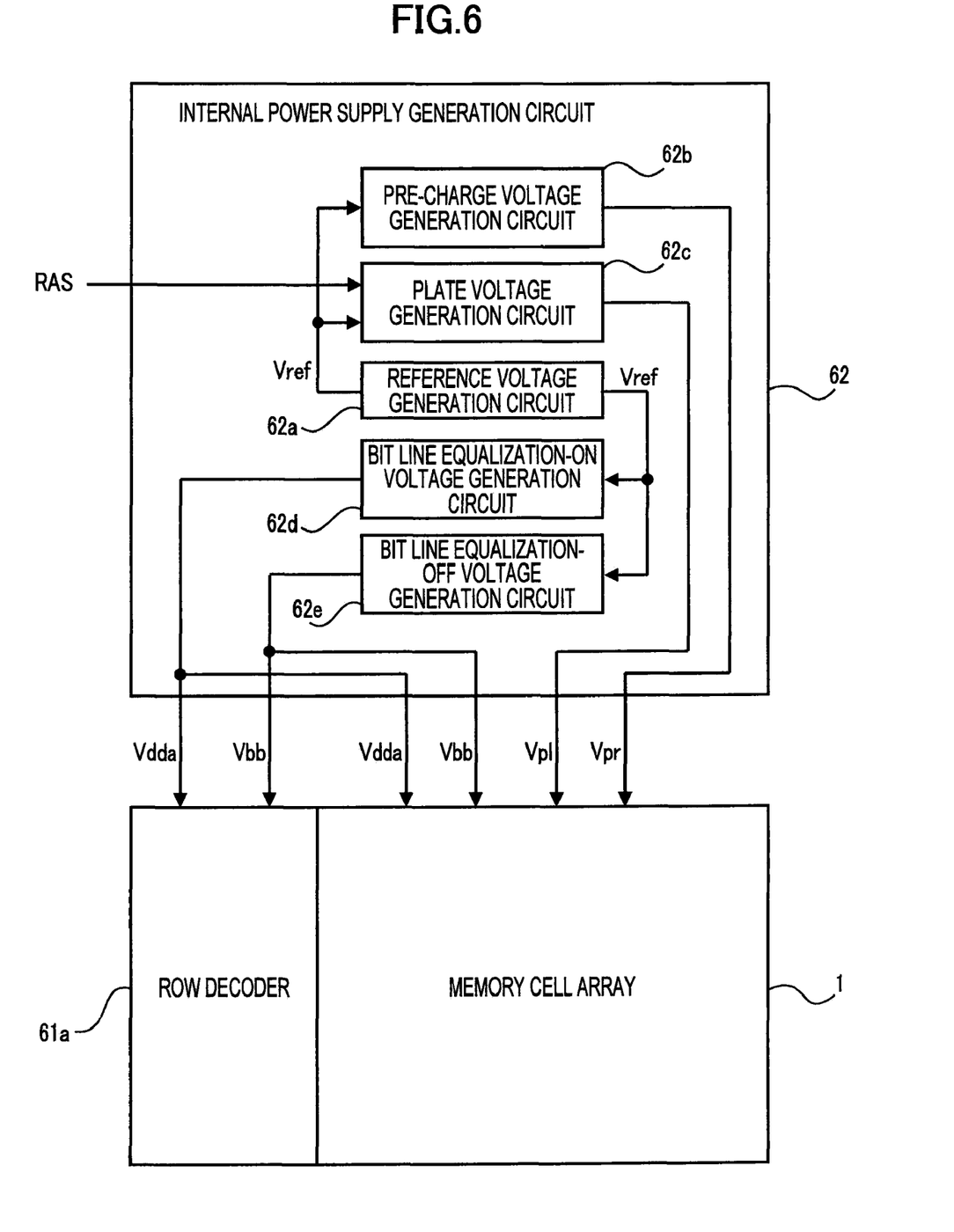
FIG. 6 is a block diagram illustrating an example of an internal power supply generation circuit in accordance with aspects of the present invention.

FIG. 6 is a block diagram illustrating an example of an internal power supply generation circuit 62 in accordance with aspects of the present invention.

The internal power supply generation circuit 62 includes a reference voltage generation circuit 62a, a pre-charge voltage generation circuit 62b, a plate voltage generation circuit 62c, a bit-line equalization turn-on voltage generation circuit 62d, and a bit-line equalization turn-off voltage generation circuit 62e.

The reference voltage generation circuit 62a supplies a reference voltage Vref to each component of the internal power supply generation circuit 62.

The pre-charge voltage generation circuit 62b generates a pre-charge voltage Vpr the size of which is a half of the power supply voltage Vdd (=Vdd/2), and supplies the voltage to the memory cell array 1.

The plate voltage generation circuit 62c includes the power supply unit 2, the switching unit 4, and the level shifter 32, which are illustrated in FIG. 1 and receives a row address strobe signal RAS, and generates a plate voltage Vpl to supply to the memory cell array 1.

A bit-line equalization turn-on voltage generation circuit 62d generates a voltage Vdda that determines an on level when a word line is off and an on level of a bit-line equalization control and supplies the voltage Vdda to the memory cell array 1 and the row decoder 61b. The bit-line equalization turn-on voltage generation circuit 62d generates a voltage Vdda, for example, that is larger than power supply voltage Vdd by the amount of a sum of a threshold Vth of the transfer transistor of the memory cell MC and a margin voltage $\alpha$(=Vdd+Vth+$\alpha$).

The bit-line equalization turn-off voltage generation circuit 62e generates a voltage Vbb that determines an off-level when a word line is on and an off-level of a bit-line equalization control and supplies the voltage Vbb to the memory cell array 1 and the row decoder 61b. The bit-line equalization turn-off voltage generation circuit 62e generates a voltage Vbb, for example, that is smaller than the ground potential Vss by the sum of a threshold Vth of the transfer transistor of the memory cell MC and a margin voltage $\alpha$(=−(Vth+$\alpha$)).

in accordance with aspects of the present invention, operation of the eDRAM 60 illustrated in FIG. 4 will be briefly described by focusing on write operation.

Figure 7:
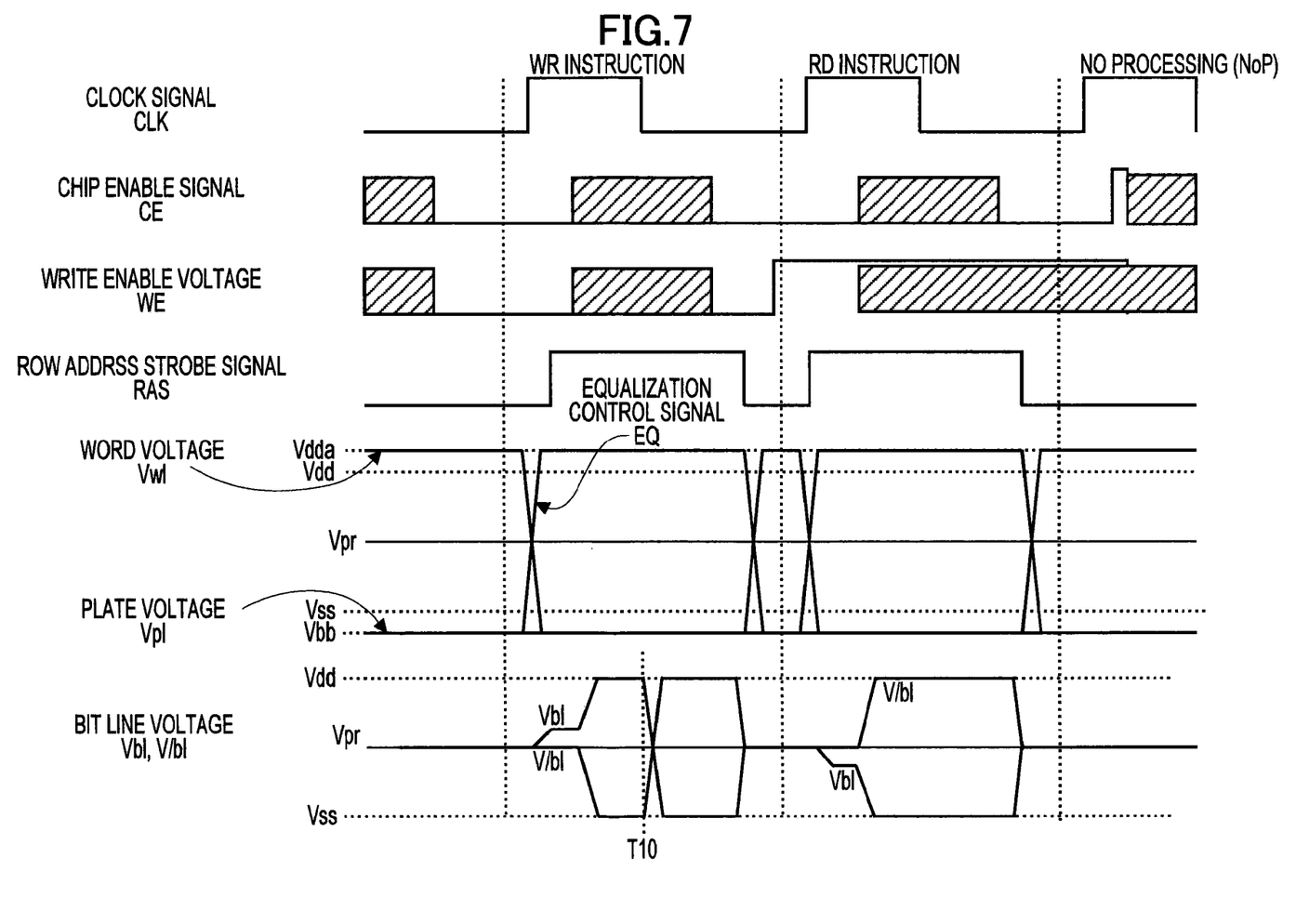
FIG. 7 is a timing chart illustrating an operation of the eDRAM in accordance with aspects of the present invention.

FIG. 7 is a timing chart illustrating operation of the eDRAM in accordance with aspects of the present invention.

The clock signal CLK, the chip enable signal CE, and the write enable signal WE are supplied from the logic circuit 50 to the eDRAM 60. The row address strobe signal RAS is a memory activation signal that is generated by the internal timing delay circuit 31 of the eDRAM 60 and may be generated, for example, by a CR delay circuit.

A word voltage Vwl falls to a voltage Vbb and an equalization control signal EQ rises to the voltage Vdda, when a row address strobe signal RAS is activated in timing with a write instruction (WR instruction). Accordingly, a small potential difference (a potential difference according to a ratio of a bit-line capacitance and a cell charge capacitance) is caused between voltages Vbl and V/bl of the bit-line pair BL and /BL.

In a data write operation from a logical value 1 to a logical value 0, the potentials of the bit-line pair BL and /BL inverts (timing T10). At this time, a disturbance may be generated, however, a current corresponding to the disturbance flows from the ground potential Vss to the plate line PL because a row address strobe signal RAS is activated and the nMOSQ7 in the switching unit 4 illustrated in FIG. 1 is turned on.

Therefore, the plate voltage Vpl may be maintained at substantially the same voltage as the voltage Vbb illustrated in FIG. 7, even when data is written substantially simultaneously to each of the memory cells MC with a high speed. Timing of read instruction (RD instruction) and operation during no processing (NoP, in other words, stand-by timing) will not be described here.

Resistance values of the resistors R1 and R2 illustrated in FIG. 1 that are desired to leak charges to the plate line PL are obtained by the following expression (1).

$$Q=CV=IT \quad (1)$$

where, Q is a charge amount, C is capacitance, V is a write voltage, I is a leak current value, and T is an operation speed.

In one example, a 512 bit eDRAM 60 is randomly accessed with 100 MHz, and data write is executed. Here, it is assumed that the capacitance C is 10 fF, and a write time T when a write voltage V is changed from 1.2 V to 0 V is 10 ns.

$$512 \times 10 \; [fF] \times 1.2 \; [V]/10 \; [ns] = 0.6 \; mA$$

In other words, in order to suppress write disturbance in the eDRAM 60, a resistance value that allows current of 0.6 mA to flow is preferable.

Moreover, when an operation frequency is changed to a low speed mode of 10 MHz, a resistance value that allows current of 61.4 µA or more to flow is preferable.

Thus, when a current supply capacity of the pump circuit 24 in the power supply unit 2 of the above described semiconductor storage device is assumed to be 1 mA, a current value may be set between 0.6 mA to 1 mA by adjusting a setting resistance value of the resistor R1.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments in accordance with aspects of the present inventions have been described in detail, it should be understood that the various changes, substitutions, and alterations could be made hereto without departing from the spirit and scope of the invention.

What is claimed is:

1. A semiconductor storage device comprising:
    a memory cell array including a memory cell that includes an MOS capacitor;
    a power supply unit configured to supply a plate voltage to a plate line that is coupled to a gate electrode of the MOS capacitor; and
    a switch coupling the plate line to a first power supply line when an access to the memory cell array is caused,
    wherein the switch is configured to detect an access to the memory cell array according to a state of a memory activation signal that activates the memory cell array.

2. The semiconductor storage device according to claim 1, wherein the first power supply line is a ground potential.

3. The semiconductor storage device according to claim 1, wherein the memory activation signal is a row address strobe signal.

4. The semiconductor storage device according to claim 1, further comprising,
    a timing control circuit configured to generate the memory activation signal and adjust a voltage of the memory activation signal to output a control signal for the switch.

5. A semiconductor storage device comprising:
    a memory cell array including a memory cell that includes an MOS capacitor;
    a power supply unit configured to supply a plate voltage to a plate line that is coupled to a gate electrode of the MOS capacitor;
    a switch coupling the plate line to a first power supply line when an access to the memory cell array is caused; and a first resistor element provided between the first power supply line and the switch.

6. The semiconductor storage device according to claim 5, wherein the first resistor element changes a resistance value according to an operation frequency of the memory cell array.

7. The semiconductor storage device according to claim 5, further comprising: a first mode selection switch provided between the switch and the first power supply line in series with the first resistor element; and a second mode selection switch and a second resistance element provided in series with the switch and the first power supply line.

8. The semiconductor storage device according to claim 7, wherein the first mode selection switch and the second mode selection switch are controlled by a mode selection signal.

* * * * *